United States Patent
Wieczorek et al.

(10) Patent No.: US 10,899,672 B2
(45) Date of Patent: Jan. 26, 2021

(54) CERAMIC MATERIAL FOR GENERATING LIGHT

(71) Applicant: KONINKLIJKE PHILIPS N.V., Eindhoven (NL)

(72) Inventors: Herfried Karl Wieczorek, Aachen (DE); Jacobus Gerardus Boerekamp, Someren (NL); Daniela Buettner, Aachen (DE); Anne-Marie Andree Van Dongen, Waalre (NL); Wilhelmus Cornelis Keur, Weert (NL); Cornelis Reinder Ronda, Aachen (DE); Sandra Johanna Maria Paula Spoor, Eindhoven (NL); Aneta Wiatrowska, Wroclaw (PL); Onno Jan Wimmers, Valkenswaard (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 641 days.

(21) Appl. No.: 15/512,855

(22) PCT Filed: Sep. 15, 2015

(86) PCT No.: PCT/EP2015/070991
§ 371 (c)(1),
(2) Date: Mar. 21, 2017

(87) PCT Pub. No.: WO2016/046013
PCT Pub. Date: Mar. 31, 2016

(65) Prior Publication Data
US 2019/0092696 A1 Mar. 28, 2019

(30) Foreign Application Priority Data

Sep. 25, 2014 (EP) .................................. 14186311

(51) Int. Cl.
*C04B 35/622* (2006.01)
*H01L 27/30* (2006.01)
(Continued)

(52) U.S. Cl.
CPC ...... *C04B 35/62222* (2013.01); *C04B 35/505* (2013.01); *C04B 35/64* (2013.01);
(Continued)

(58) Field of Classification Search
CPC .................. C04B 35/505; C04B 35/64; C04B 2235/3222; C04B 2235/3225;
(Continued)

(56) References Cited

U.S. PATENT DOCUMENTS 5,831,269 A 11/1998 Nakamura
8,872,119 B2 * 10/2014 Hardy .................. C04B 35/632
250/370.11
(Continued)

FOREIGN PATENT DOCUMENTS

DE 102012206180 10/2013
DE 102012109650 4/2014
(Continued)

OTHER PUBLICATIONS

Brabec, et al., "Plastic Solar Cells", Advanced Functional Materials, vol. 11, No. 1, pp. 15 to 26 (2001).
(Continued)

*Primary Examiner* — Taeho Jo (57) ABSTRACT

The invention relates to a ceramic material (14) for generating light when irradiated with radiation, wherein the ceramic material comprises a stack of layers (15, 16) having different compositions and/or different dopings. The ceramic material may be used in a spectral computed tomography (CT) detector, in order to spectrally detect x-rays, or it may be used as a ceramic gain medium of a laser such that
(Continued)

temperature gradients and corresponding thermo-mechanical stresses within the gain medium can be reduced.

19 Claims, 7 Drawing Sheets

(51) Int. Cl.
| | |
|---|---|
| H01S 3/06 | (2006.01) |
| H01S 3/0941 | (2006.01) |
| H01S 3/16 | (2006.01) |
| C04B 35/505 | (2006.01) |
| C04B 35/64 | (2006.01) |
| G01T 1/20 | (2006.01) |
| G01T 1/202 | (2006.01) |
| G21K 4/00 | (2006.01) |
| C09K 11/08 | (2006.01) |
| H01L 33/50 | (2010.01) |
| C09K 11/77 | (2006.01) |

(52) U.S. Cl.
CPC .......... *C09K 11/08* (2013.01); *C09K 11/7774* (2013.01); *G01T 1/202* (2013.01); *G01T 1/2008* (2013.01); *G21K 4/00* (2013.01); *H01L 27/308* (2013.01); *H01L 33/504* (2013.01); *H01S 3/0617* (2013.01); *H01S 3/0941* (2013.01); *H01S 3/1611* (2013.01); *H01S 3/1643* (2013.01); *H01S 3/1685* (2013.01); *C04B 2235/3222* (2013.01); *C04B 2235/3225* (2013.01); *C04B 2235/602* (2013.01); *C04B 2235/6025* (2013.01); *C04B 2235/9661* (2013.01); *G21K 2004/06* (2013.01); *H01S 3/061* (2013.01); *H01S 3/0612* (2013.01); *H01S 3/09415* (2013.01); *H01S 3/164* (2013.01); *H01S 3/1613* (2013.01)

(58) Field of Classification Search
CPC ...... C04B 2235/602; C04B 2235/6025; C04B 2235/9661; C09K 11/08; C09K 11/7774; G01T 1/2008; G01T 1/202; G21K 4/00; G21K 2004/06; H01L 27/308; H01L 33/504; H01S 3/0617; H01S 3/0941; H01S 3/1611; H01S 3/1643; H01S 3/1685; H01S 3/061; H01S 3/0612; H01S 3/09415; H01S 3/1613; H01S 3/164
USPC .................................................. 250/370.11
See application file for complete search history.

(56) References Cited

U.S. PATENT DOCUMENTS

| | | | | |
|---|---|---|---|---|
| 2003/0020044 A1* | 1/2003 | Lyons | ........... | C04B 35/495 252/301.5 |
| 2003/0127630 A1* | 7/2003 | Vartuli | ........... | C09K 11/7774 252/301.4 R |
| 2003/0141484 A1* | 7/2003 | Yamada | ........... | C09K 11/7774 252/301.4 R |
| 2004/0100000 A1* | 5/2004 | Kobusch | ........... | C04B 35/50 264/654 |
| 2006/0067472 A1* | 3/2006 | Possin | ........... | G01T 1/202 378/98.9 |
| 2007/0158573 A1 | 7/2007 | Deych | | |
| 2008/0063138 A1* | 3/2008 | Levene | ........... | G01T 1/201 378/19 |
| 2008/0210885 A1* | 9/2008 | Bolyasnikova | ........ | C04B 35/64 250/473.1 |
| 2008/0308736 A1 | 12/2008 | Suzuki | | |
| 2010/0148074 A1* | 6/2010 | Menge | ........... | G01T 1/1644 250/362 |
| 2010/0155610 A1* | 6/2010 | Menge | ........... | G01T 1/00 250/368 |
| 2010/0270462 A1* | 10/2010 | Nelson | ........... | G01T 1/202 250/252.1 |
| 2011/0024684 A1* | 2/2011 | Fukuta | ........... | C04B 35/44 252/301.4 R |
| 2011/0042571 A1* | 2/2011 | Perna | ........... | G01T 1/2006 250/361 R |
| 2011/0114887 A1 | 5/2011 | Ronda | | |
| 2011/0227477 A1 | 9/2011 | Zhang | | |
| 2012/0141771 A1* | 6/2012 | Pan | ........... | B32B 18/00 428/312.8 |
| 2012/0153163 A1* | 6/2012 | Levene | ........... | G01T 1/249 250/361 R |
| 2012/0223236 A1* | 9/2012 | Shah | ........... | C04B 35/44 250/362 |
| 2012/0225767 A1* | 9/2012 | Imholt | ........... | C04B 35/553 501/1 |
| 2013/0043430 A1* | 2/2013 | Nakamura | ........... | G21K 4/00 252/301.4 R |
| 2013/0058452 A1* | 3/2013 | Levene | ........... | G01T 1/2018 378/19 |
| 2013/0270482 A1* | 10/2013 | Jiang | ........... | C09K 11/7774 252/301.6 R |
| 2013/0292574 A1 | 11/2013 | Levene | | |
| 2014/0113130 A1* | 4/2014 | Jagannathan | ........ | B05D 3/00 428/339 |
| 2014/0306116 A1* | 10/2014 | Roessl | ........... | G01T 1/2008 250/362 |
| 2014/0321609 A1* | 10/2014 | Levene | ........... | G01T 1/208 378/19 |
| 2015/0001398 A1* | 1/2015 | Ronda | ........... | G01T 1/202 250/362 |
| 2015/0033541 A1* | 2/2015 | Nitta | ........... | G01T 1/2008 29/460 |
| 2015/0275080 A1* | 10/2015 | Ronda | ........... | G01T 1/2985 250/362 |
| 2015/0323685 A1* | 11/2015 | Nelson | ........... | G01T 1/1614 250/370.08 |
| 2016/0061962 A9* | 3/2016 | Ronda | ........... | G01T 1/2002 250/362 |
| 2016/0230085 A1* | 8/2016 | Terazawa | ........... | C09K 11/7701 |
| 2017/0009135 A1* | 1/2017 | Cao | ........... | C09K 11/7774 |

FOREIGN PATENT DOCUMENTS

| | | |
|---|---|---|
| EP | 2703844 | 3/2014 |
| JP | 2001208854 | 8/2001 |
| RU | 2476943 C2 | 2/2013 |
| WO | 2004/095068 | 11/2004 |
| WO | 2012/080927 | 6/2012 |
| WO | 2013/080104 | 6/2013 |

OTHER PUBLICATIONS

Roessl, et al., "K-edge imaging in x-ray computed tomography using multi-bin photon counting detectors", Physics in Medicine and Biology, vol. 52(15), pp. 4679 to 4696 (2007).

* cited by examiner

CERAMIC MATERIAL FOR GENERATING LIGHT

CROSS REFERENCE TO RELATED APPLICATIONS

This application is the U.S. National Phase application under 35 U.S.C. § 371 of International Application No. PCT/EP2015/070991, filed Sep. 15, 2015, published as WO 2016/046013 on Mar. 31, 2016, which claims the benefit of European Patent Application Number 14186311.8 filed Sep. 25, 2014. These applications are hereby incorporated by reference herein.

FIELD OF THE INVENTION

The invention relates to ceramic material for generating light when irradiated with radiation. The invention relates further to a detection device for detecting radiation and a laser comprising the ceramic material. Moreover, the invention relates to an imaging system for imaging an object, which comprises the detection device, and to a manufacturing method and a manufacturing apparatus for manufacturing the ceramic material. The invention relates also to a computer program for controlling the manufacturing apparatus.

BACKGROUND OF THE INVENTION

A ceramic material may be used, for instance, as a ceramic scintillator in a detection device of a computed tomography (CT) system for detecting x-rays. However, ceramic scintillators do generally not provide energy dependent scintillation light, thereby making it difficult to use ceramic scintillators in detection devices for spectral CT systems. Moreover, a laser may comprise a ceramic material as ceramic gain medium. However, the pump light of the laser may be spatially very inhomogeneously distributed within the ceramic gain medium, which may result in high temperature gradients in the ceramic gain medium and hence to thermo-mechanical stress peaks.

SUMMARY OF THE INVENTION

It is an object of the present invention to provide a ceramic material for generating light when irradiated with radiation, which allows mitigating at least one of the above mentioned drawbacks. It is a further object of the present invention to provide a detection device for detecting radiation and a laser, which comprise the ceramic material, and to provide an imaging system for imaging an object, which comprises the detection device. Moreover, it is an object of the present invention to provide a manufacturing method and a manufacturing apparatus for manufacturing the ceramic material and to provide a computer program for controlling the manufacturing apparatus.

In a first aspect of the present invention a ceramic material for generating light when irradiated with radiation is presented, wherein the ceramic material comprises a stack of layers having different compositions and/or different dopings.

Since the ceramic material comprises a stack of layers having different compositions and/or different dopings, the ceramic material can be adapted to generate light, when irradiated with radiation, such that at least one of the above mentioned drawbacks may be mitigated. For instance, if the stack of layers comprises a first layer and a second layer having different compositions and/or different dopings, wherein the first layer is adapted to, when irradiated with the radiation, generate first radiation and the second layer is adapted to, when irradiated with the radiation, generate second radiation and wherein the first radiation and the second radiation are different, by distinguishing the first radiation and the second radiation from each other it can be determined whether the radiation has been generated in the first layer or in the second layer. This can be used, for example, in a spectral CT system, in which the ceramic material having the first and second layers is used as scintillator material of a detection device, in order to distinguish radiation emanating from an upper part of the ceramic scintillator material, which may be formed by the first layer, and radiation from a lower part of the ceramic scintillator material, which may be formed by the second layer, from each other, wherein the scintillator material may be arranged such that its upper part is closer to an x-ray source of the spectral CT system than the lower part. The ceramic scintillator material can also be adapted to generate radiation when irradiated with other radiation, especially other ionizing radiation like gamma radiation.

In an embodiment the first layer and the second layer are both formed within the same, i.e. a single, piece of ceramic material. In other words the ceramic structure extends continuously between the first layer and the second layer. The ceramic manufacturing processes described herein lend themselves to such a manufacturing process. Advantageously by making the layers within the same piece of material, optical losses arising from reflections at the interfaces between layers formed in otherwise separate pieces of abutting or glued, scintillator materials are avoided. This improves the light output of the ceramic material and consequently the sensitivity of a detector that includes the ceramic material. As described later, in another embodiment the ceramic material may have a garnet structure. Thus, in this embodiment the garnet structure extends continuously between the first layer and the second layer.

In an embodiment the layers of the stack of layers are adapted such that in a direction perpendicular to the layers the concentration of a dopant monotonically increases or monotonically decreases from layer to layer. Such a ceramic material may be used as a ceramic gain medium in a laser, wherein a pump light source and the ceramic gain medium may be arranged such that the dopant concentration in the stack of layers of the ceramic gain medium monotonically increases from layer to layer with increasing distance to the pump light source. If the ceramic gain medium had a homogeneous dopant distribution, the pump light distribution within the ceramic gain medium would have an exponential decay, which may induce high-temperature gradients and hence thermo-mechanical stress peaks. This would limit the maximum incident pump power. However, the monotonically increasing dopant concentration, which may form a longitudinal gradient structure of dopant concentrations along a longitudinal axis of a rod like ceramic gain medium, can minimize these problems.

The ceramic material may comprise, especially be, a garnet. For instance, the ceramic material may comprise one or more materials selected from a group consisting of gadolinium oxysulfide (GOS) doped with $Pr^{3+}$, yttrium gadolinium garnet doped with $Eu^{3+}$, lutetium gadolinium gallium aluminum garnet (LGGAG), gadolinium gallium aluminum garnet (GGAG), lutetium aluminum garnet (LuAG), lutetium gallium aluminum garnet (LuGAG), gadolinium aluminum garnet (GdAG), gadolinium gallium aluminum garnet (GdGAG), yttrium aluminum garnet (YAG), yttrium terbium aluminum garnet (YTAG), yttrium gadolinium aluminum garnet (YGAG), terbium aluminum garnet (TbAG), and a terbium gadolinium gallium aluminum garnet (TbGGAG). In an embodiment the ceramic material comprises a combination of these garnets. GOS doped with $Pr^{3+}$ and/or $(Y, Gd)_2O_3$:Eu may be used as scintillator material in a detection device of a CT system. LGGAG, GGAG, YTAG and/or YGAG may be used as scintillator material of a detection device of a positron emission tomography (PET) system. The advantage of using garnets is the high light yield, the easy fabrication of optically transparent ceramic materials, and the possibility to adjust the exact mixture of elements to the parameters needed for the respective application.

In a further aspect of the present invention a detection device for detecting radiation is presented, wherein the detection device comprises a ceramic scintillator comprising a ceramic material as defined in claim 2 and a detector for generating a first detection value depending on the first radiation and a second detection value depending on the second radiation. Such a detection device allows for a distinction of radiation generated in different parts of the ceramic material. This can be used, for instance, in a spectral CT system for spectrally detecting x-ray quanta or in a PET system for eliminating the depth-of-interaction (DOI) effect and for increasing the spatial resolution of the PET imaging system.

In an embodiment the detector comprises a first detection unit for generating the first detection value depending on the first radiation and a second detection unit for generating the second detection value depending on the second radiation, wherein a) the first detection unit is arranged between the ceramic scintillator and the second detection unit and wherein the first detection unit is at least partly transparent for the second radiation or b) the first detection unit and the second detection unit are both arranged next to each other on a side of the ceramic scintillator. Since the first detection unit is used for detecting the first radiation and the second detection unit is used for detecting the second radiation, the first and second detection units can be optimized substantially independently from each other. This can lead to an improved accuracy of detecting the first radiation and the second radiation.

The detector may be adapted to distinguish the first radiation and the second radiation from each other depending on their wavelengths and/or their decay times. Distinguishing the first radiation and the second radiation from each other depending on the wavelengths and/or the decay times allows for an accurate distinction and hence to a further improved accuracy of generating the first detection value depending on the first radiation and the second detection value depending on the second radiation.

In a further aspect of the present invention an imaging system for imaging an object is presented, wherein the imaging system comprises a) a detection device for detecting radiation from the object as defined in claim 5, wherein the detection device generates first and second detection values, and b) a reconstruction unit for reconstructing an image of the object based on the first and second detection values. The imaging system is, for instance, a CT system, a PET system or a single photon emission computed tomography (SPECT) system.

In a further aspect of the present invention a laser is presented, wherein the laser comprises a) a laser resonator, b) a ceramic gain medium for amplifying light by stimulated emission within the laser resonator, wherein the ceramic gain medium comprises a ceramic material as defined in claim 1, and c) a pump light source for pumping the ceramic gain medium by using pump light. Preferentially, the pump light source and the ceramic gain medium are arranged such that the ceramic gain medium is pumped in a pumping direction being perpendicular to the layers of the ceramic material. Moreover, the different layers of the stack of layers of the ceramic material preferentially comprise different dopant concentrations, wherein the pump light source and the ceramic gain medium are preferentially arranged such that the dopant concentration in the stack of layers of the ceramic gain medium monotonically increases from layer to layer with increasing distance to the pump light source.

In a further aspect of the present invention a manufacturing method for manufacturing a ceramic material as defined in claim 1 is presented, wherein the manufacturing method comprises a) layer-wisely providing ceramic compounds having different compositions and/or different dopings and b) sintering the layer-wisely provided ceramic compounds. The sintered product may be further annealed to reduce lattice defects, grinded and polished. These steps can lead to a high quality ceramic material, which may be used as, for instance, a ceramic scintillator or as a ceramic gain medium of a laser. In a preferred embodiment the layer-wise provision of the ceramic compounds includes a) layer-wisely providing the ceramic compounds in a mold and/or b) producing tapes of the ceramic compounds having different compositions and/or different dopings by tape casting and stacking the produced tapes for providing a tape stack and/or c) printing different layers of a photosensitive paste comprising the ceramic compounds having different compositions and/or different dopings and irradiating the different layers and/or d) printing different layers of a suspension comprising the ceramic compounds having different compositions and/or different dopings on a substrate. These steps of layer-wisely providing the ceramic compounds can lead to a further improved ceramic material, which may be used, for instance, as ceramic scintillator or as ceramic gain medium.

In a further aspect of the present invention a manufacturing apparatus for manufacturing the ceramic material as defined in claim 1 is presented, wherein the manufacturing apparatus comprises a) a layer providing unit for providing layers comprising ceramic compounds having different compositions and/or different dopings and b) a sintering unit for sintering the layers.

In a further aspect of the present invention a computer program for controlling a manufacturing apparatus as defined in claim 14 is presented, wherein the computer program comprises program code means for causing the manufacturing apparatus to carry out the steps of the manufacturing method as defined in claim 12, when the computer program is run on a computer controlling the manufacturing apparatus.

It shall be understood that the ceramic material of claim 1, a detection device for detecting radiation of claim 5, the imaging system of claim 8, the laser of claim 9, the manufacturing method of claim 12, the manufacturing apparatus of claim 14 and the computer program of claim 15 have similar and/or identical preferred embodiments, in particular, as defined in the dependent claims.

It shall be understood that a preferred embodiment of the present invention can also be any combination of the dependent claims or above embodiments with the respective independent claim.

These and other aspects of the invention will be apparent from and elucidated with reference to the embodiments described hereinafter.

DETAILED DESCRIPTION OF EMBODIMENTS

Figure 1:
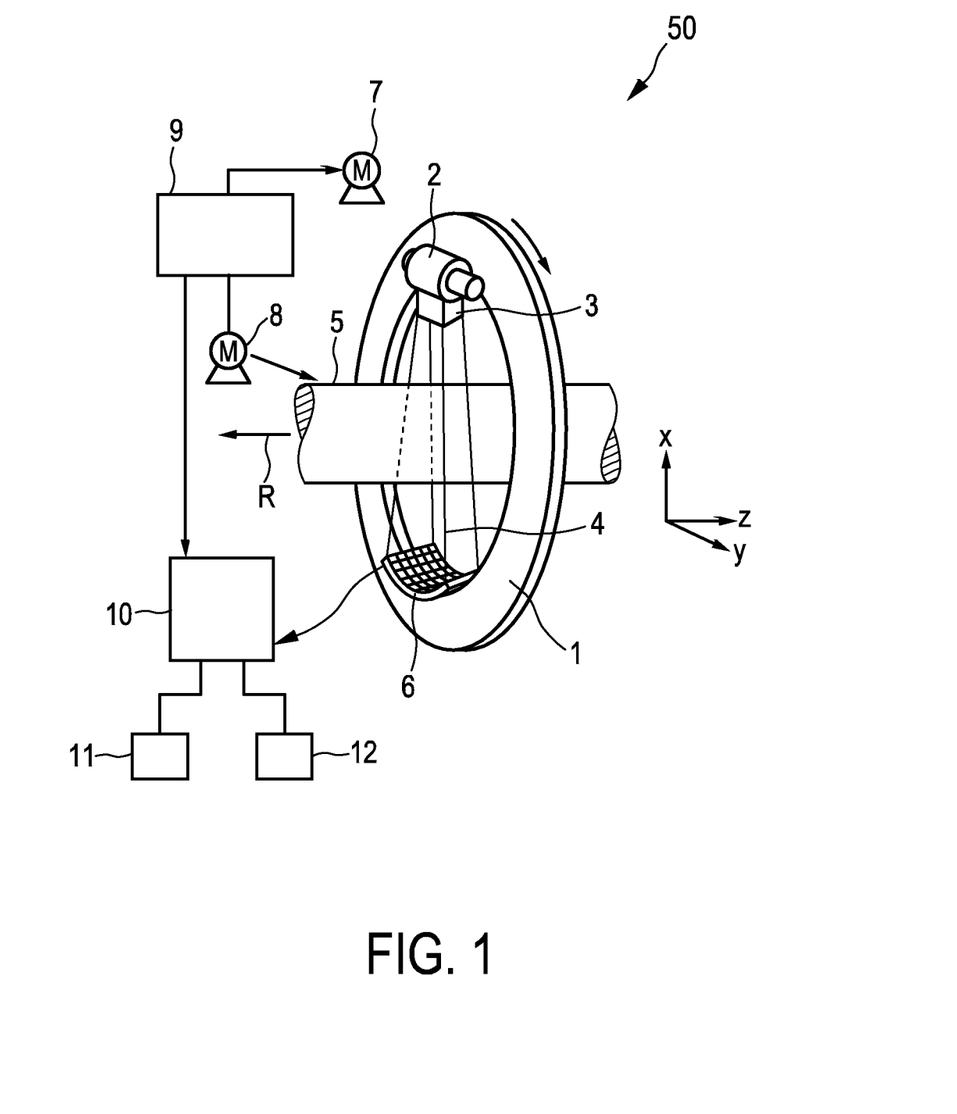
FIG. 1 shows schematically and exemplarily an embodiment of an imaging system for imaging an object.

FIG. 1 shows schematically and exemplarily an embodiment of an imaging system 50 for imaging an object. In this embodiment the imaging system 50 is a spectral CT system. The spectral CT system 50 includes a gantry 1 which is capable of rotation about a rotational axis R which extents parallel to a z direction. A radiation source 2, which in this embodiment is an x-ray tube, is mounted on the gantry 1. The radiation source 2 is provided with a collimator 3, which in this embodiment forms a conical radiation beam 4 from the radiation generated by the radiation source 2. The radiation traverses an object (not shown) such as a patient in an examination zone 5 being, in this embodiment, cylindrical. After having traversed the examination zone 5 the radiation beam 4 is incident on a detection device 6 comprising a two-dimensional detection surface. Also the detection device 6 is mounted on the gantry 1.

The spectral CT system 50 comprises two motors 7, 8, wherein the gantry 1 is driven at a preferably constant but adjustable angular speed by the motor 7 and the motor 8 is provided for displacing the object, which is preferentially arranged on a support means like a table, parallel to the direction of the rotational axis R or the z axis. These motors 7, 8 are controlled by a control unit 9, for instance, such that the radiation source 2 and the object move relative to each other along a helical directory. However, it is also possible that the object is not moved, but that only the radiation source 2 is rotated, i.e. that the radiation source 2 moves along a circular directory relative to the object. Furthermore, in another embodiment the collimator 3 can be adapted for forming another beam shape, in particular, a fan beam and the detection device 6 can comprise a detection surface which is shaped corresponding to the other beam shape, in particular, to the fan beam.

During a relative movement of the radiation source 2 and the object the detection device 6 generates detection values depending on the radiation incident on the detection surface of the detection device 6, wherein the generated detection values are provided to a reconstruction unit 10 for reconstructing an image of the object. The reconstructed image may be shown on a display 12. The CT system 50 further comprises an input unit 11 like a keyboard, a computer mouse, a touch pad, et cetera, in order to allow a user like a radiologist to enter commands like start or stop commands and parameters like acquisition parameters or reconstruction parameters into the CT system 50. Also the reconstruction unit 10 and further components of the CT system 50 may be controlled by the control unit 9.

Figure 2:
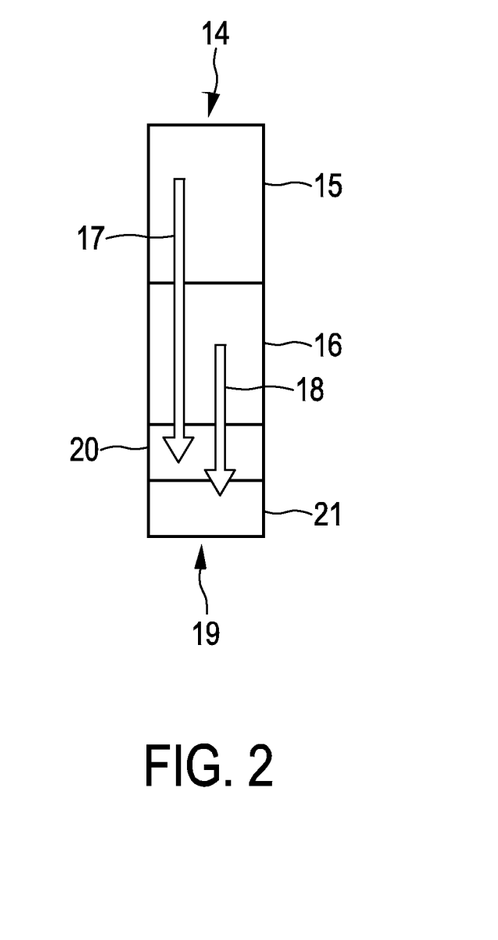
FIG. 2 shows schematically and exemplarily an embodiment of a ceramic scintillator and of a detector of a detection device of the imaging system.

The detection device 6 comprises several detection elements, i.e. several detection pixels, arranged in an array, wherein each detection element comprises a ceramic scintillator 14 and a detector 19 as schematically and exemplarily illustrated in FIG. 2. The ceramic scintillator 14 comprises a first layer 15 and a second layer 16 having different compositions and/or different dopings, wherein the first layer 15 is adapted to, when irradiated with x-rays, generate first radiation 17 and the second layer 16 is adapted to, when irradiated with the x-rays, generate second radiation 18 and wherein the first radiation 17 and the second radiation 18 have different wavelengths.

The detector 19 comprises a first detection unit 20 for generating first detection values depending on the first radiation 17 and a second detection unit 21 for generating second detection values depending on the second radiation 18, wherein the first detection unit 20 is arranged between the ceramic scintillator 14 and the second detection unit 21 and the first detection unit 20 is transparent for the second radiation 18. The first and second detection units 20, 21 are preferentially organic photodiodes such that the respective detection element of the detection device 6 may comprise a double layer of organic photodiodes, wherein the upper layer, which is preferentially directly below the ceramic scintillator 14, is sensitive to a first wavelength range of the first radiation 17 and transparent to a second wavelength range of the second radiation 18 and wherein the lower photodiode layer is sensitive to the second wavelength range.

The organic photodiodes comprise at least one region or layer with an organic material that can generate movable electrical charges (typically electron-hole pairs) by absorbing incident photons. The generated charges can then be detected by electrodes to which a suitable voltage is applied. An advantage of organic photodiodes is that they can cost effectively be produced. Moreover, their absorption characteristics can largely be tuned, for example by using an appropriate mixture of different organic materials. The organic photodiodes may in general comprise any organic material that is suited to absorb incident photons and convert them into an electrical signal and/or that can support this process as a hole or electron transport material or as a dopant. As an example, an organic photodetector may comprise at least one organic material selected from the group consisting of:

PEDOT (poly(3,4-ethylenedioxythiophene),
PSS (poly(styrenesulfonate)),
P3HT (poly 3-hexylthiophene),
PCBM (6,6-phenyl C61-butyric acid methyl ester),
C60,
ZnPc (Zinc phthalocyanine),
MeO-TPD (N,N,N',N'-tetrakis(4-methoxyphenyl)-benzidine),
p-NPB (N,N'-bis(Inaphthyl)-N,N'-diphenyl-1,1'-biphenyl-4,4'-diamine),
TTN,
F4TCNQ (2,3,5,6-Tetrafluoro-7,7,8,8-tetracyanoquinodimethane),
DCV5T (bis(2,2-dicyanovinyl)-quinquwthiophene),
derivatives or modifications of the above substances.

Further appropriate organic materials may be found in literature, for instance, in the article "Plastic Solar Cells" by Ch. J. Brabec et al., Advanced Functional Materials, volume 11, number 1, pages 15 to 26 (2001), which are herewith incorporated by reference.

In another embodiment the first and second detection units may be arranged in another way. For instance, as schematically and exemplarily illustrated in FIG. 3, a detector 30 can comprise a first detection unit 31 for generating first detection values depending on the first radiation 17 and a second detection unit 32 for generating second detection values depending on the second radiation 18, wherein the first and second detection units 31, 32 are arranged next to each other on a same side of the ceramic scintillator 14. The first detection unit 31 preferentially comprises an optical filter, which substantially only allows the first radiation 17 to pass through, and the second detection unit 21 preferentially comprises a further optical filter, which substantially only allows the second radiation 18 to pass through. The first and second detection units 31, 32 preferentially comprise photodiodes like silicon photodiodes and silicon photomultipliers. The optical filters, which may be arranged in front of the photodiodes, may be long wave pass (LWP) and short wave pass (SWP) interference filters.

Figure 3:
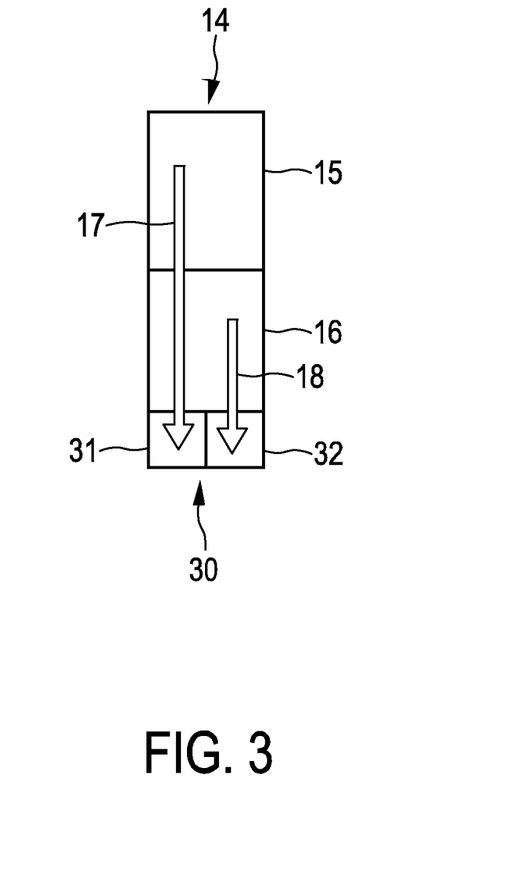
FIG. 3 shows schematically and exemplarily a further embodiment of a ceramic scintillator and of a detector of a detection device of the imaging system.

Thus, for each detection element or pixel of the detection device 6 a double array of photodiodes with different spectral sensitivity may be provided, in order to differentiate between emission spectra emitted from different depths.

In the first layer 15 of the ceramic material 14 lower energy x-ray quanta and in the second layer 16 of the ceramic material 14 higher energy x-ray quanta generate the respective radiation. Thus, the first detection values being indicative of the first radiation 17 generated in the first layer 15 and the second detection values being indicative of the second radiation 18 generated in the second layer 16 can be used for distinguishing different energies of the x-ray quanta. The reconstruction unit 10 is preferentially adapted to reconstruct a spectral CT image based on the first and second detection values by using known spectral reconstruction algorithms like the spectral reconstruction algorithm disclosed in the article "K-edge imaging in x-ray computed tomography using multi-bin photon counting detectors" by E. Roessl and R. Proksa, Physics in Medicine and Biology, volume 52(15), pages 4679 to 4696 (2007), which is herewith incorporated by reference.

Figure 4:
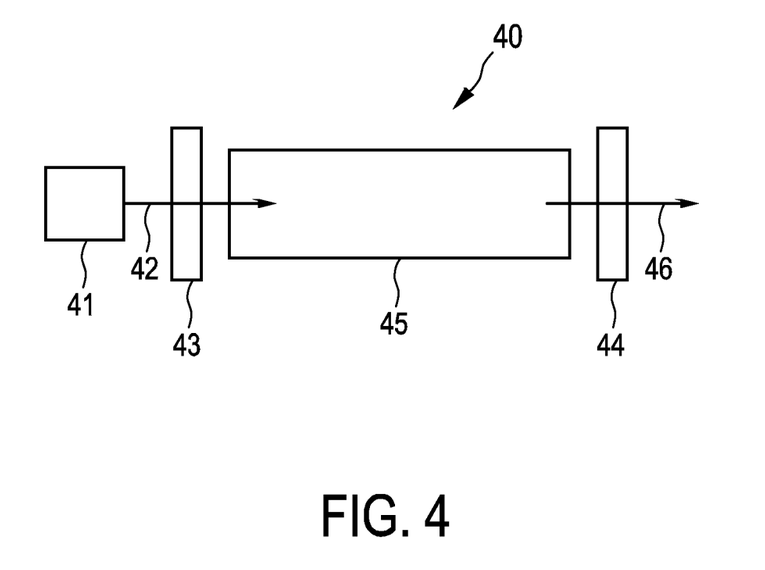
FIG. 4 shows schematically and exemplarily an embodiment of a laser.

FIG. 4 shows schematically and exemplarily an end-pumped laser 40 comprising two mirrors 43, 44 forming a laser resonator, a ceramic gain medium 45 for amplifying light by stimulated emission within the laser resonator 43, 44 and a pump light source 41 for pumping the ceramic gain medium 45 by using pump light 42. The generated laser light is denoted by reference number 46. The ceramic gain medium 45 is exemplarily and schematically illustrated in more detail in FIG. 5.

Figure 5:
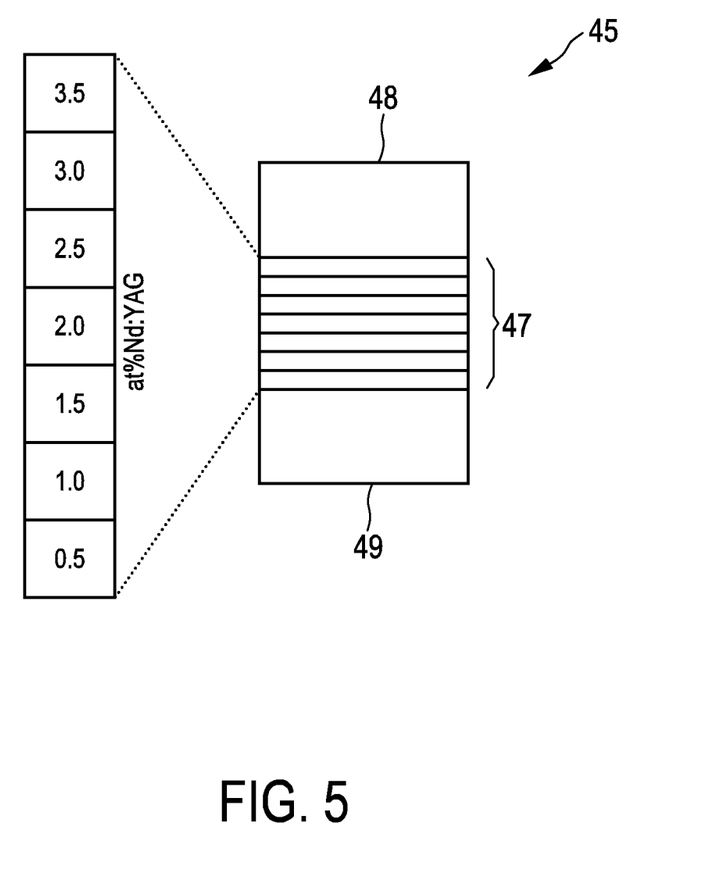
FIG. 5 shows schematically and exemplarily an embodiment of a ceramic gain medium of the laser.

The ceramic gain medium 45 comprises two undoped parts 48, 49 and an intermediate stack of layers 47 having different dopant concentrations. In this embodiment the undoped parts 48, 49 are pure yttrium aluminum garnet (YAG) parts and the stack of layers 47 is formed by YAG layers having different neodymium concentrations. The YAG layers may each have a thickness of, for instance, 300 μm, or they may have another thickness. For instance, in this embodiment the stack of layers 47 may comprise seven YAG layers, wherein the atomic percentage of neodymium may increase from 0.5 to 3.5. The pump light source 41 and the ceramic gain medium 45 are arranged such that the ceramic gain medium 45 is pumped in a pumping direction being perpendicular to the layers 47 of the ceramic material 45. Moreover, the pump light source 41 and the ceramic gain medium 45 are arranged such that the dopant concentration in the stack of layers 47 of the ceramic gain medium 45 increases from layer to layer within increasing distance to the pump light source 41. The entire ceramic gain medium 45, which may be a ceramic rod, may have a length of, for instance, about 10 mm.

The pump light source 41 may be a laser diode. It may be adapted to generate pump light having a wavelength within a wavelength range of 730 to 760 nm or within a wavelength range of 790 to 820 nm. The mirrors 43, 44 of the laser resonator are known mirrors which are generally used in laser resonators of end-pumped lasers, wherein the first mirror 43 is transparent for the pump light 42 and reflects the laser light 46 and the second mirror 44 mainly reflects the laser light 46 and is partially transparent for the laser light 46, in order to couple a part of the laser light 46 out of the ceramic gain medium 45.

Figure 6:
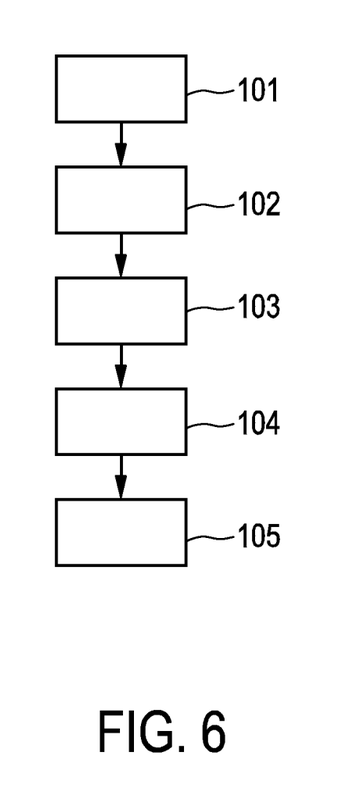
FIG. 6 shows a flowchart exemplarily illustrating an embodiment of a manufacturing method for manufacturing a ceramic material, and FIG. 7 schematically and exemplarily shows an embodiment of a manufacturing apparatus for manufacturing a ceramic material.

In the following an embodiment of a manufacturing method for manufacturing a ceramic material will exemplarily be described with reference to a flow chart shown in FIG. 6. An embodiment of a manufacturing apparatus 60, which may be used for carrying out the manufacturing method, is schematically and exemplarily shown in FIG. 7.

Figure 7:
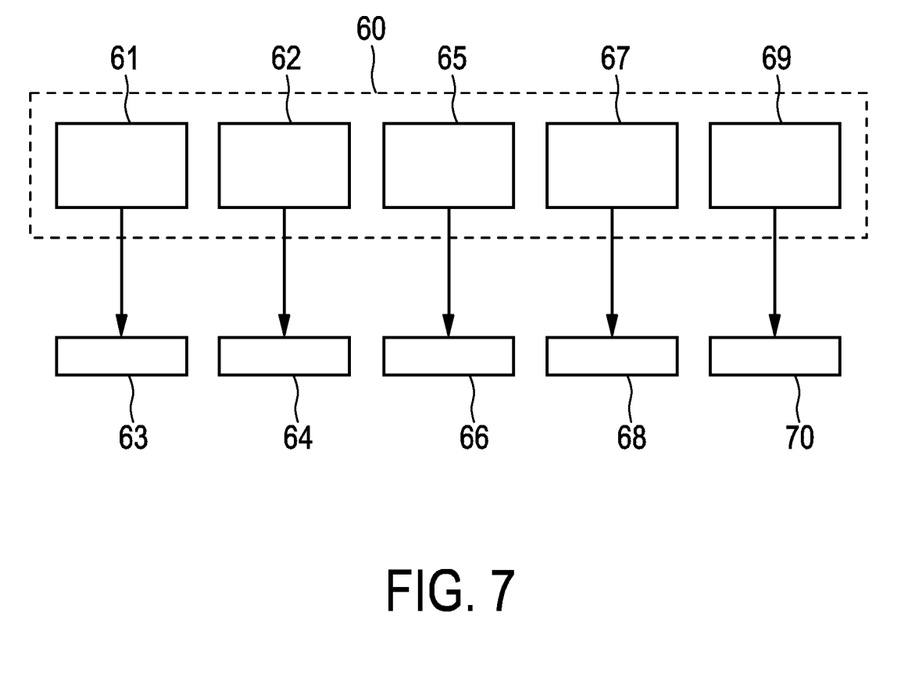

In step 101 a layer providing unit 61 provides laser-wisely ceramic compounds having different compositions and/or different dopings and in step 102 a sintering unit 62 sinters the layer-wisely provided ceramic compounds. In FIG. 7 the intermediate product, i.e. the green body before sintering, is denoted by reference number 63 and the stack of layers after sintering is denoted by reference number 64. In this embodiment the manufacturing apparatus 60 further comprises an annealing unit 65 for annealing the sintered stack of layers in step 103, which results in an intermediate annealed product 66. The annealed intermediate product 66 is grinded by using a grinding unit 67 in step 104, which results in a grinded intermediate product 68. The grinded intermediate product 68 is then polished by a polishing unit 69, wherein the polished ceramic material is denoted by reference number 70.

The layer-wise provision of the ceramic compounds having different compositions and/or different dopings can be done by, for instance, adding different mixtures of raw materials, which may include $X_3(Al,Ga)_5O_{12}$ and one or several activator compounds, into a mold used for pressing the green body of the ceramic material, wherein X is an element selected from the group consisting of yttrium, gadolinium, terbium, dysprosium, holmium, erbium, thulium, ytterbium and lutetium. The one or several activator compounds are preferentially rare earth oxides like cerium, praseodymium, neodymium, samarium, europium, terbium, dysprosium, holmium, erbium, thulium or ytterbium oxides. In particular, different mixtures, which include yttrium gallium aluminum oxides and one or several rare earth compounds like cerium and/or terbium and/or praseodymium oxides, are added into a mold used for pressing the green body of the ceramic material. The resulting green body, which might be a green body stick, can then be sintered, in order to form, for example, a polycrystalline garnet product. The sintered material can then be annealed, grinded and polished. A layer-wise doping or composition variation can also be achieved by using additive manufacturing techniques which may form the green-phase body. For instance, tape casting can be used, wherein green tapes of various compositions and/or dopings and optionally also various thicknesses can easily be produced. The tapes can be dried and then stacked together in any desired order. The resulting stack can then be pressed and cut into a final green product, which can be fired, i.e. sintered, in order to obtain a final luminescent ceramic product.

In a further embodiment the layers may be provided by using a photosensitive paste containing green-phase particles for building up the ceramic material, wherein layers of this paste are sequentially exposed. By changing the paste composition a well-defined depth-dependent doping of the ceramic material and/or depth-dependent host lattice composition of the ceramic material may be obtained. The green phase particles are preferentially oxides like yttrium gallium aluminum oxides and rare earth oxides or other oxides, which are used for building up the ceramic material. The green phase particles are preferentially homogenously distributed within the photosensitive paste. The paste can be cured by using, for instance, ultraviolet light or blue light. In another embodiment a non-photosensitive paste may be used, wherein in this case a thermal curing may be applied. The garnet structure is obtained from the oxides when the paste is sintered at high temperature. The resulting ceramics is then annealed, grinded and polished for forming the ceramic material.

In a further embodiment inkjet printing may be used for layer-wisely providing the ceramic compounds. Here, droplets of a suspension containing green-phase particles of the ceramic compounds are jetted on a substrate in a predetermined pattern and dried. By changing the composition of the suspension droplets, the required doping or host lattice composition profile can be obtained. The resulting green body can then be sintered, annealed, grinded and polished.

All these technologies provide an easy way to clearly define dopant concentrations and/or host lattice compositions in different depths of the resulting ceramic which might be a scintillator ceramic or a gain medium ceramic. If the ceramic material should be used for forming an array of detection pixels of a detection device, i.e. an array of detection elements of the detection device, the respective ceramic scintillators can be arranged into the desired arrays using simple pick-and-place techniques.

Ceramic scintillators are preferred over single crystalline scintillators because of their low cost price, arbitrary shape, and the possibility to produce compounds that are not possible to grow as a crystal. The ceramic scintillators may be used in a detection device of a CT system or of other imaging systems like a PET system or a SPECT system.

The manufacturing method and the manufacturing apparatus can be used to produce ceramic scintillators having different dopants and/or different dopant concentrations and/or different compositions of the host material, especially different densities of the host material, in different depths. For instance, a produced ceramic scintillator might comprise a change in a garnet composition over a length axis of the ceramic scintillator, i.e. in the direction of, for example, an x-ray beam of a CT system, leading to different emission spectra of only one kind of activator at different positions along the length axis. This may allow for a distinction of scintillator emission according to its wavelength by using a spectrally sensitive detector, which may comprise a photodiode layer with photodiodes of different spectral sensitivity. Thus, a detection device can comprise an array of ceramic scintillators, which are transparent to the emitted light such that the respective light signal generated in different depths can be read out with, for instance, a double layer photodiode array below the ceramic scintillators.

Although in the embodiment described above with reference to FIGS. 2 and 3 the ceramic scintillator has two layers having different compositions and/or dopings only, in other embodiments the ceramic scintillator can comprise more layers having different compositions and/or dopings. Correspondingly, the detector can comprise more than two detection units assigned to a respective ceramic scintillator, in order to distinguish the radiation coming from the different layers. Moreover, although in above described embodiments the wavelengths have been used, in order to determine from which layer the respective radiation emanates, in other embodiments other characteristics of the radiation can be used for distinguishing the different kinds of radiation. For instance, differences of the decay times of different activator ions in the ceramic scintillator can be used. In this way the different contributions to the respective signal are detected in time rather than in the frequency domain. Simple algorithms can be used to disentangle the contribution of each of the activator ions and to calculate the relative contribution of each of the scintillator segments to the total signal detected. As an example, deconvolution of signals measured in few adjacent frames, separating into sub-signals with different decay time constants, can be used to separate signals from the upper and lower detector layers.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Operations like the layer-wisely provision of the ceramic compounds having different dopings and/or compositions, the sintering, et cetera performed by one or several units or devices can be performed by any other number of units or devices. The control of the manufacturing apparatus in accordance with the manufacturing method and also other operations like the control of the imaging system, the reconstruction of an image et cetera may be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention claimed is:

1. A detection device for detecting gamma or x-ray radiation, the detection device comprising:
a ceramic scintillator comprising a ceramic material for generating light when irradiated with radiation, the ceramic material comprising a stack of layers, comprising a first layer and a second layer each comprising a garnet structure, and at least one of i) different compositions ii) different dopants iii) different dopant concentrations, the first layer, when irradiated with the x-ray radiation, is adapted to generate first radiation, and the second layer, when irradiated with the x-ray radiation, is adapted to generate second radiation, the first radiation and the second radiation being different, wherein the first layer is transparent to the second radiation; and a detector adapted to generate a first detection value depending on the first radiation, and a second detection value depending on the second radiation, the detector comprising: a first detection structure adapted to generate the first detection value depending on the first radiation; and a second detection structure adapted to generate the second detection value depending on the second radiation, wherein the first detection structure and the second detection structure are disposed adjacent to and in contact with each other on a side of the ceramic scintillator.

2. The detection device as defined in claim 1 wherein the first layer and the second layer are both formed within the same piece of ceramic material.

3. The detection device as defined in claim 1 wherein both the first layer and the second layer are formed from the same composition and have different dopants and/or different dopant concentrations.

4. The detection device as defined in claim 3 wherein the composition is selected from a composition group $X_3(Al,Ga)_5O_{12}$ wherein X is an element selected from the group consisting of yttrium, gadolinium, terbium, dysprosium, holmium, erbium, thulium, ytterbium and lutetium and wherein the dopant is selected from the group consisting of cerium, praseodymium, neodymium, samarium, europium, terbium, dysprosium, holmium, erbium, thulium or ytterbium.

5. The detection device as defined in claim 1 wherein the ceramic scintillator comprises a radiation-receiving face for receiving gamma or x-ray radiation, wherein the radiation-receiving face is substantially parallel to each layer of the stack of layers.

6. The detection device as defined in claim 1 wherein the first layer is adjacent to the second layer.

7. The detection device as defined in claim 1 wherein the first radiation and the second radiation are different in at least one of wavelength or decay time.

8. The detection device as defined in claim 1, wherein the layers of the stack of layers are adapted such that in a direction perpendicular to the layers the concentration of a dopant monotonically increases from layer to layer.

9. The detection device as defined in claim 1, wherein the detector is adapted to distinguish the first radiation and the second radiation from each other depending on their wavelengths and/or their decay times.

10. The detection device as defined in claim 1, wherein the second layer is transparent to the first radiation.

11. A detection device for detecting gamma or x-ray radiation, the detection device comprising:

a ceramic scintillator comprising a ceramic material for generating light when irradiated with radiation, the ceramic material comprising a stack of layers, comprising a first layer and a second layer each comprising a garnet structure, and at least one of i) different compositions ii) different dopants iii) different dopant concentrations, the first layer, when irradiated with the x-ray radiation, is adapted to generate first radiation, and the second layer, when irradiated with the x-ray radiation, is adapted to generate second radiation, the first radiation and the second radiation being different;

a first optical filter, which is substantially transparent to the first radiation and substantially opaque to the second radiation;

a second optical filter, which substantially transparent to the second radiation and substantially opaque to the first radiation; and a detector adapted to generate a first detection value depending on the first radiation, and a second detection value depending on the second radiation, the detector comprising: a first detection structure adapted to generate the first detection value depending on the first radiation; and a second detection structure adapted to generate the second detection value depending on the second radiation, wherein the first detection structure and the second detection structure are disposed adjacent to and in contact with each other on a side of the ceramic scintillator.

12. The detection device as defined in claim 11, wherein the first layer and the second layer are both formed within the same piece of ceramic material.

13. The detection device as defined in claim 11, wherein both the first layer and the second layer are formed from the same composition and have different dopants and/or different dopant concentrations.

14. The detection device as defined in claim 13, wherein the composition is selected from a composition group $X_3(Al,Ga)_5O_{12}$ wherein X is an element selected from the group consisting of yttrium, gadolinium, terbium, dysprosium, holmium, erbium, thulium, ytterbium and lutetium and wherein the dopant is selected from the group consisting of cerium, praseodymium, neodymium, samarium, europium, terbium, dysprosium, holmium, erbium, thulium or ytterbium.

15. The detection device as defined in claim 11, wherein the ceramic scintillator comprises a radiation-receiving face for receiving gamma or x-ray radiation, wherein the radiation-receiving face is substantially parallel to each layer of the stack of layers.

16. The detection device as defined in claim 11, wherein the first layer is adjacent to the second layer.

17. The detection device as defined in claim 11, wherein the first radiation and the second radiation are different in at least one of wavelength or decay time.

18. The detection device as defined in claim 11, wherein the layers of the stack of layers are adapted such that in a direction perpendicular to the layers the concentration of a dopant monotonically increases from layer to layer.

19. The detection device as defined in claim 11, wherein the detector is adapted to distinguish the first radiation and the second radiation from each other depending on their wavelengths and/or their decay times.

* * * * *